(12) United States Patent
Mao

(10) Patent No.: US 11,127,736 B2
(45) Date of Patent: Sep. 21, 2021

(54) MIM CAPACITOR AND METHOD FOR MAKING THE SAME

(71) Applicant: Shanghai Huali Integrated Circuit Corporation, Shanghai (CN)

(72) Inventor: Yongji Mao, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 0 days.

(21) Appl. No.: 16/818,208

(22) Filed: Mar. 13, 2020

(65) Prior Publication Data
US 2021/0083043 A1    Mar. 18, 2021

(30) Foreign Application Priority Data

Sep. 12, 2019    (CN) .......................... 201910862712.7

(51) Int. Cl.
*H01L 27/06*    (2006.01)
*H01L 21/027*    (2006.01)
(Continued)

(52) U.S. Cl.
CPC ...... *H01L 27/0629* (2013.01); *H01L 21/0274* (2013.01); *H01L 21/31144* (2013.01);
(Continued)

(58) Field of Classification Search
CPC .......... H01L 21/0274; H01L 21/31144; H01L 21/32115; H01L 21/32139; H01L 21/823437; H01L 21/823487; H01L 21/8238; H01L 21/823828; H01L 21/823885; H01L 27/06; H01L 27/0617; H01L 27/0629; H01L 27/105; H01L 27/2436; H01L 27/2454; H01L 28/40;
(Continued)

(56) References Cited

U.S. PATENT DOCUMENTS

| 6,309,925 | B1 | 10/2001 | Jung et al. |
| 2008/0173978 | A1* | 7/2008 | Tu .......................... H01G 4/002 |
| | | | 257/532 |

(Continued)

FOREIGN PATENT DOCUMENTS

| CN | 103681282 A | 3/2014 |
| KR | 20060078861 A | 7/2006 |

*Primary Examiner* — Cheung Lee
(74) *Attorney, Agent, or Firm* — Alston & Bird LLP

(57) ABSTRACT

A method of making MIM capacitors includes: forming well regions in a semiconductor substrate, forming a gate dielectric layer on the semiconductor substrate, forming a polysilicon gate structure on a surface of the well region, forming a dummy gate on the gate dielectric layer and removing the dummy gate to expose the gate dielectric layer, and forming a metal gate structure on the exposed gate dielectric layer, wherein the metal gate structure comprises an electrode barrier layer on the gate dielectric layer and a metal gate on the gate dielectric layer. A lower electrode plate of the MIM capacitor is formed in the process of forming the metal gate structure, forming a capacitor dielectric layer above the lower electrode plate, and forming an upper electrode plate on the capacitor dielectric layer. Manufacturing of the MIM capacitor can be integrated in the process of manufacturing the semiconductor integrated circuit.

14 Claims, 12 Drawing Sheets

(51) Int. Cl.
*H01L 21/311* (2006.01)
*H01L 21/321* (2006.01)
*H01L 21/3213* (2006.01)
*H01L 49/02* (2006.01)
*H01L 29/49* (2006.01)
*H01L 29/66* (2006.01)

(52) U.S. Cl.
CPC .. *H01L 21/32115* (2013.01); *H01L 21/32139* (2013.01); *H01L 28/75* (2013.01); *H01L 29/4966* (2013.01); *H01L 29/66545* (2013.01)

(58) Field of Classification Search
CPC ......... H01L 28/60; H01L 28/75; H01L 29/40; H01L 29/401; H01L 29/41; H01L 29/4966; H01L 29/66007; H01L 29/66409; H01L 29/66477; H01L 29/66484; H01L 29/66545; H01L 29/66666
See application file for complete search history.

(56) References Cited

U.S. PATENT DOCUMENTS

| | | |
|---|---|---|
| 2014/0138693 A1 | 5/2014 | Ham et al. |
| 2014/0264750 A1 | 9/2014 | Chang et al. |
| 2014/0284671 A1* | 9/2014 | Hung ................ H01L 21/76877 257/296 |
| 2014/0319591 A1* | 10/2014 | Toda ....................... H01L 28/60 257/296 |
| 2018/0342502 A1 | 11/2018 | Su et al. |

* cited by examiner

MIM CAPACITOR AND METHOD FOR MAKING THE SAME

CROSS-REFERENCES TO RELATED APPLICATIONS

This application claims priority to Chinese patent application No. CN201910862712.7, filed on Sep. 12, 2019, and entitled "MIM CAPACITOR AND METHOD FOR MAKING THE SAME", the disclosure of which is incorporated herein by reference in entirety.

TECHNICAL FIELD

The present disclosure relates to the field of semiconductor integrated circuits, in particular to manufacturing technology of MIM capacitors.

BACKGROUND OF THE DISCLOSURE

In manufacturing semiconductor integrated circuits (IC), the requirements for high performing semiconductor devices have become harder and more demanding. Semiconductor capacitors are important components of an integrated circuit and are widely used in semiconductor chips such as memories, RF devices, smart IC cards, high voltage power devices, and semiconductor electronic filters. Specifically IC capacitors are applied in band-pass filters, phase-locked loops, dynamic random access memories, and the likes. As semiconductor technologies keep on shrinking device sizes, it is expected that the IC capacitors in the integrated circuit devices meet requirements of high density, low leakage, and linearity behavior in low voltage ranges. However, these requirements have been very challenging in IC capacitor manufacturing in the semiconductor industry.

Various kinds of IC capacitors used in semiconductor IC chips include MOS FET (metal oxide silicon field effect transistor) capacitors, PIP (poly-insulator-poly) capacitors, variable-junction capacitors, and some of the MIM (metal-insulator-metal) capacitors and MOM (metal-oxide-metal) capacitors mostly used in a BEOL (Back-End-Of-Line) interconnecting structure. The BEOL capacitors in interconnecting layers typically are stacked up structures above the area of the active device structure, thus, their linearity characteristics of these BEOL capacitors are far better than that of other types of capacitors in the front end of the active device areas. However, even at present time, commonly used BEOL capacitors such as MIM capacitors and MOM capacitors, are manufactured in special processes. These special processes make the already very complicated manufacturing process of integrated circuits even more complex, driving up the cost. In other words, the process for manufacturing MIM capacitors and MOM capacitors in BEOL interconnecting structures are not completed in the same steps of making the active semiconductor devices in the IC process. so Please refer to FIGS. 1a to 1e, which describes a process for manufacturing an MIM capacitor in the related art. As illustrated in FIG. 1, a substrate and front end structures are made before MIM process starts. The front end structure process is not described here and not shown in FIG. 1. In FIG. 1a, at first, a first photo resist layer is patterned into a hole 110 in a lithography process and the hole 110 is then etched into via structures 210 in FIG. 1b. In FIG. 1c, a second photo resist layer is patterned into holes 120 in a lithography process and the hole 120 is then etched into via structures 220 in FIG. 1d. After forming two vias 210 and 220, metal is filled into the vias 210 and 220 to form two metal electrodes 230. Although the MIM capacitors formed in this way have the advantages of high capacitance density, small leakage, and high capacitance accuracy, the manufacturing cost of the MIM capacitor is high.

FIGS. 2a-2c show three kinds of different MOM capacitors according to related arts. In FIGS. 1a-1c, each has a top view of the capacitors and a bottom view of the cross section of the capacity. In each view, the darker structures represent one electrode of the capacitor, and the lighter structures represent of the other electrode. As illustrated in FIGS. 2a-2c, the three kinds of MOM capacitors includes an MOM capacitor in FIG. 2a, an APMOM capacitor in FIG. 2b, and a VNCAP capacitor in FIG. 2c. FIG. 2a upper part shows the two electrode layers, 102a (the darker layer) and 103a (the lighter layer), of the MOM capacitor in a top view, and FIG. 2a bottom part shows a cross sectional view of the electrodes in a cut perpendicular to the upper part, where 102a' (the darker layer) and 103a' (the lighter layer) represent network of the two layers of the electrodes of the MOM capacitors. FIG. 2b upper part shows the two electrode layers, 102b (the darker layer) and 103b (the lighter layer), of the APMOM capacitor in a top view, and FIG. 2b bottom part shows a cross sectional view of the electrodes in a cut perpendicular to the upper part, where 102b' (the darker layer) and 103b' (the lighter layer) represent network of the two layers of the electrodes of the APMOM capacitors. FIG. 2c upper part shows the two electrode layers, 102c (the darker layer) and 103c (the lighter layer), of the VNCAP capacitor in a top view, and FIG. 2c bottom part shows a cross sectional view of the electrodes in a cut perpendicular to the upper part, where 102c' (the darker layer) and 103c' (the lighter layer) represent network of the two layers of the electrodes of the VNCAP capacitors. Each of the MOM capacitors combine the overall capacitance between the upper (the darker) and lower (lighter) metal wires located at the same layer. Extra cost of the existing manufacturing process of the MOM capacitors coming from the special manufacturing process causing large leakage current and increased size of the chips.

BRIEF SUMMARY OF THE DISCLOSURE

According to some embodiments in this application, a method for manufacturing a MIM capacitor in an IC circuit is disclosed in the following steps: S1: providing a semiconductor substrate; forming a plurality of well regions in the semiconductor substrate; forming a gate dielectric layer on a surface of the semiconductor substrate; forming a polysilicon gate structure on a surface of the plurality of well regions; forming a dummy gate on the gate dielectric layer, wherein the dummy gate is removed then to expose the gate dielectric layer; and forming a metal gate structure on the exposed gate dielectric layer, wherein the metal gate structure comprises an electrode barrier layer on the gate dielectric layer and a metal gate on the gate dielectric layer; wherein a lower electrode plate of the MIM capacitor is formed in the process of forming the metal gate structure. S2: forming a capacitor dielectric layer above the lower electrode plate of the MIM capacitor; and S3: forming an upper electrode plate of the MIM capacitor on the capacitor dielectric layer to make the MIM capacitor.

The MIM capacitor is manufactured in an integrated process with manufacturing the active CMOS devices.

DETAILED DESCRIPTION OF THE DISCLOSURE

The technical solution of the present disclosure will be clearly and completely described below with reference to the drawings. Obviously, the described embodiments are part of the embodiments of the present disclosure, instead of all of them. Based on the embodiments in the present disclosure, all other embodiments obtained by one skilled in the art without contributing any inventive labor shall fall into the protection scope of the present disclosure.

Figure 1A:
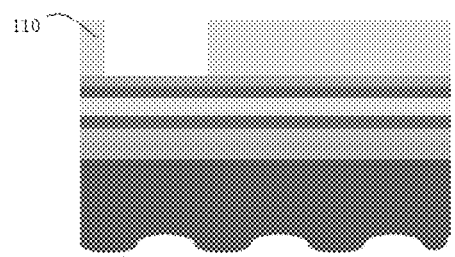
FIGS. 1a-1e is a schematic diagram of a process for manufacturing an MIM capacitor in related arts.
Figure 1B:
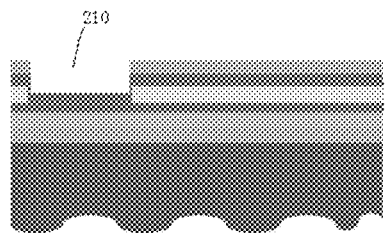
Figure 1C:
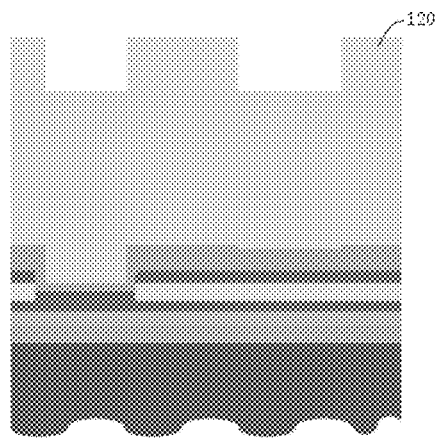
Figure 1D:
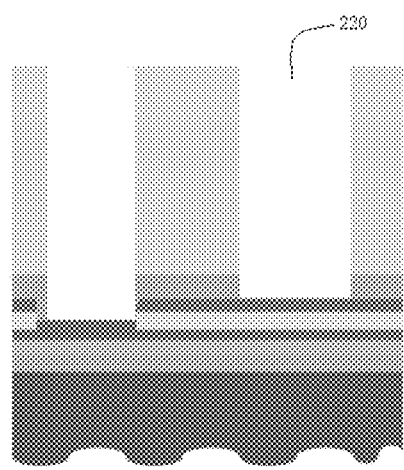
Figure 1E:
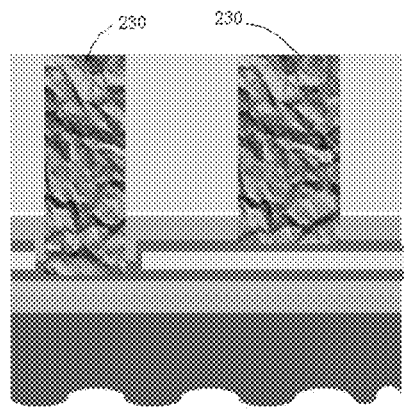
Figure 2A:
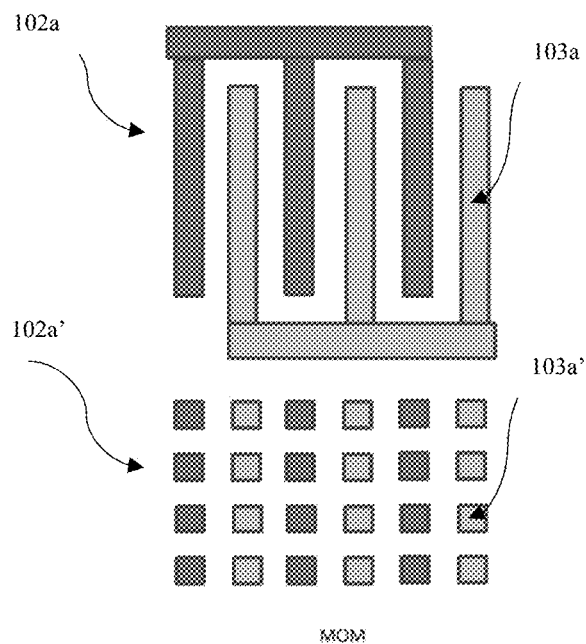
FIGS. 2a-2c is schematic diagrams of three types of MOM capacitors in related arts.
Figure 2B:
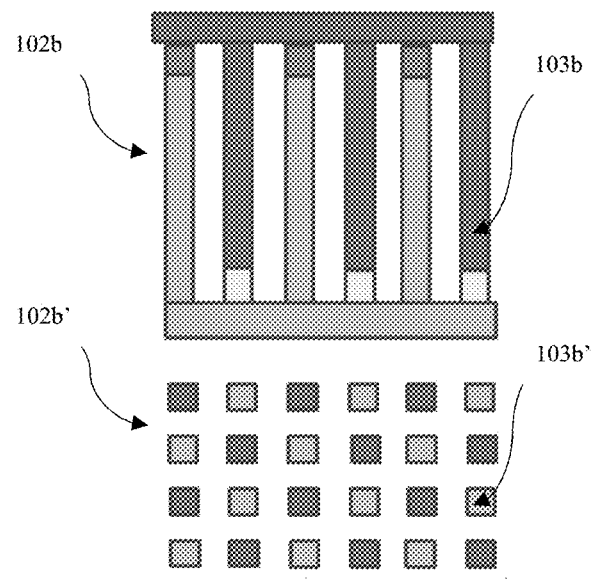
Figure 2C:
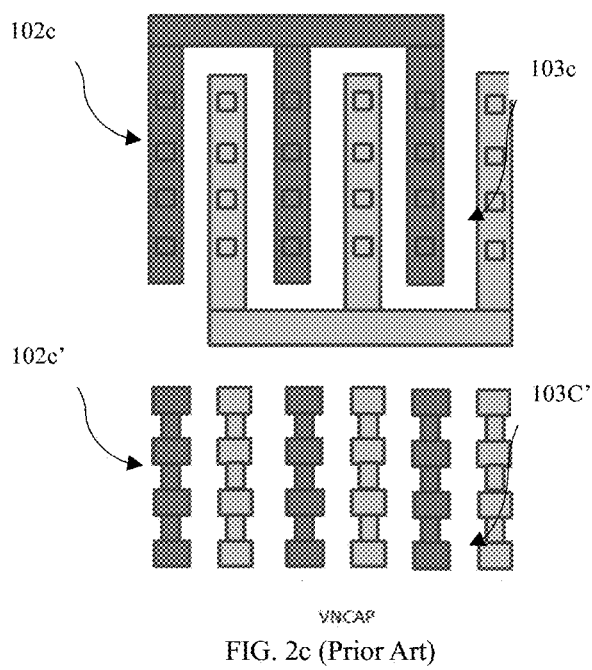
Figure 3:
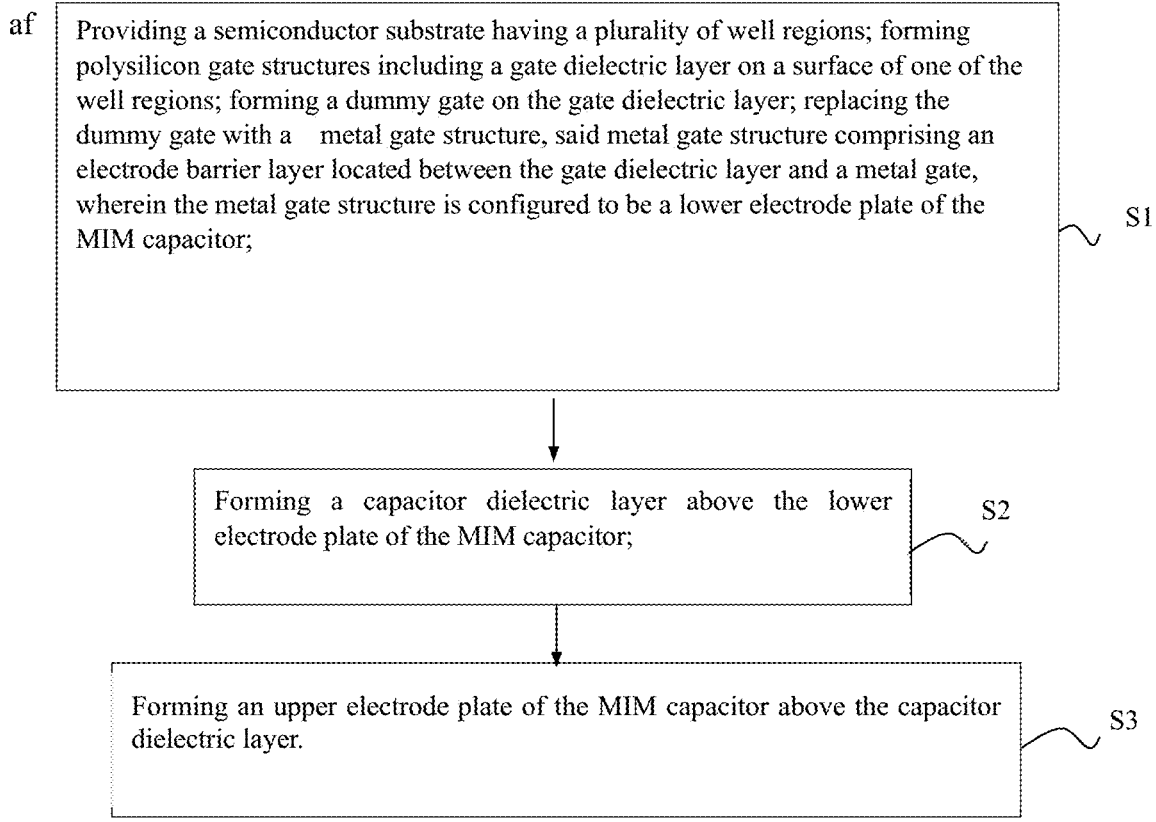
FIG. 3 is a flowchart of the method for manufacturing an MIM capacitor, according to embodiments of the present disclosure.

One embodiment of the present disclosure provides a method for manufacturing an MIM capacitor. Specifically, FIG. 3, discloses a flowchart of the method for manufacturing an MIM capacitor, according to one embodiment of the present disclosure. In FIG. 3, step S1 includes: providing a semiconductor substrate having a plurality of well regions; forming polysilicon gate structures including a gate dielectric layer on a surface of one of the well regions; forming a dummy gate on the gate dielectric layer; replacing the dummy gate with a metal gate structure, said metal gate structure comprising an electrode barrier layer located between the gate dielectric layer and a metal gate, wherein the metal gate structure is configured to be a lower electrode plate of the MIM capacitor; Step S2 includes forming a capacitor dielectric layer above the lower electrode plate of the MIM capacitor; Step S3 includes forming an upper electrode plate of the MIM capacitor above the capacitor dielectric layer. These steps of making the MIM capacitor are described in more details in combining with FIG. 4.

Figure 4:
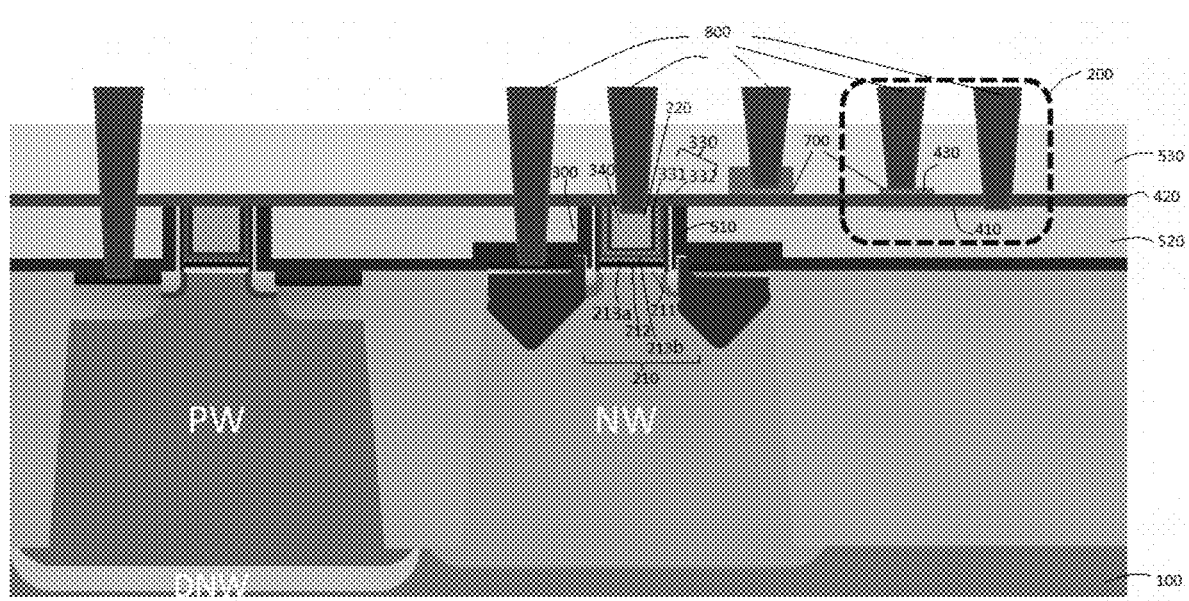
FIG. 4 is a cross sectional view of an MIM capacitor structure in a semiconductor integrated circuit, according to embodiments of the present disclosure.
Figure 5A:
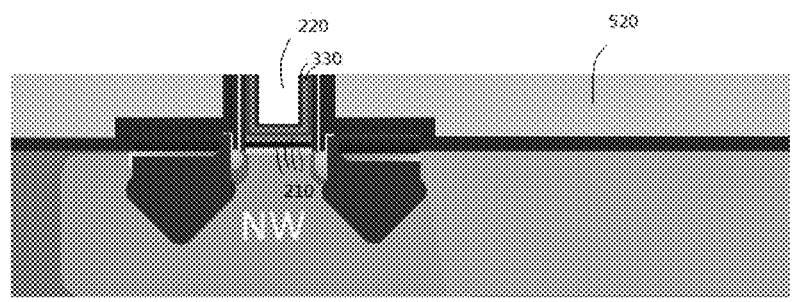
FIGS. 5a-5e illustrate a process for manufacturing a lower electrode plate of an MIM capacitor, according to one embodiment of the present disclosure.
Figure 5B:
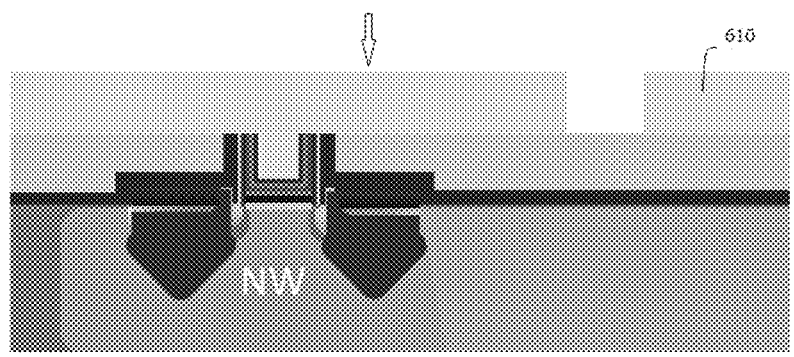
Figure 5C:
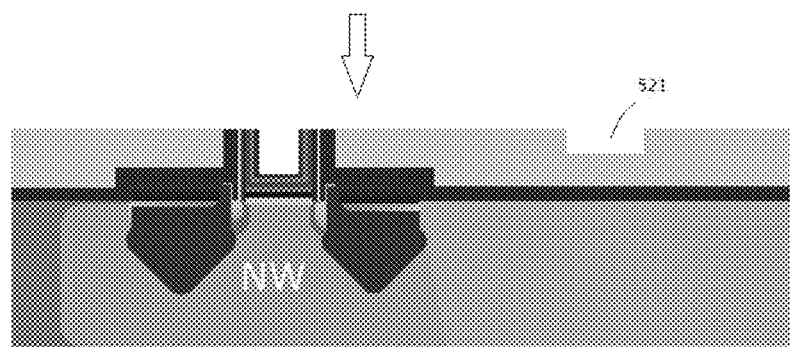
Figure 5D:
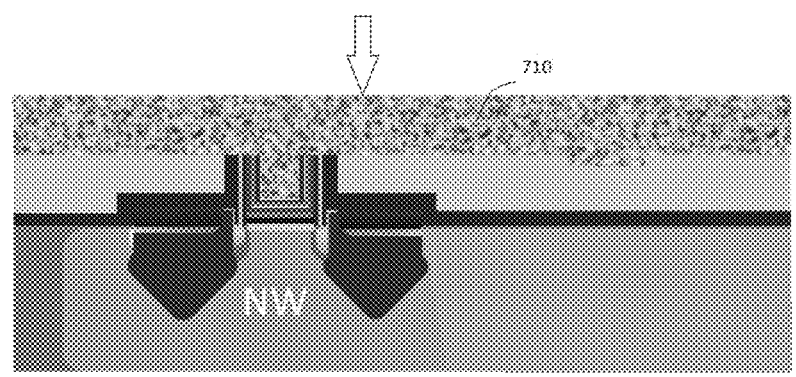
Figure 5E:
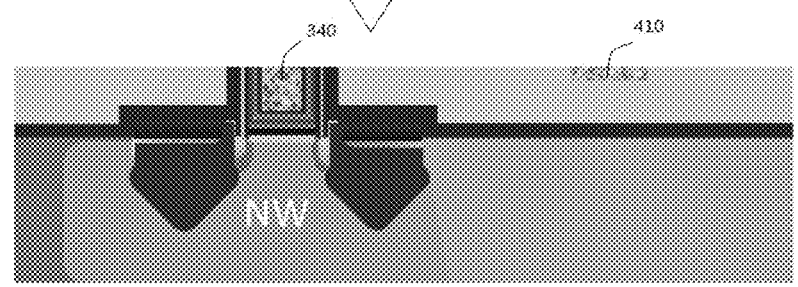
Figure 6A:
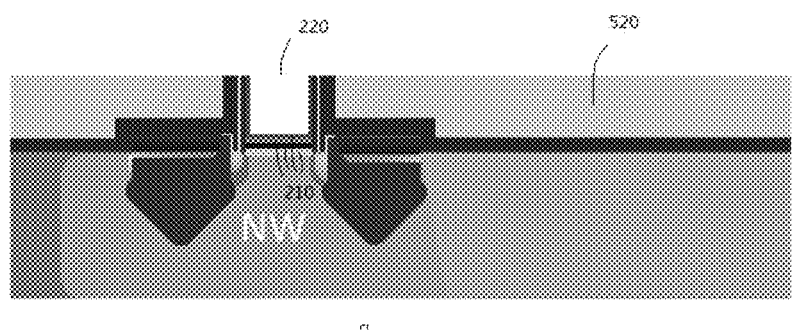
FIGS. 6a-6e is illustrate a process for manufacturing a lower electrode plate of an MIM capacitor, according to another embodiment of the present disclosure.
Figure 6B:
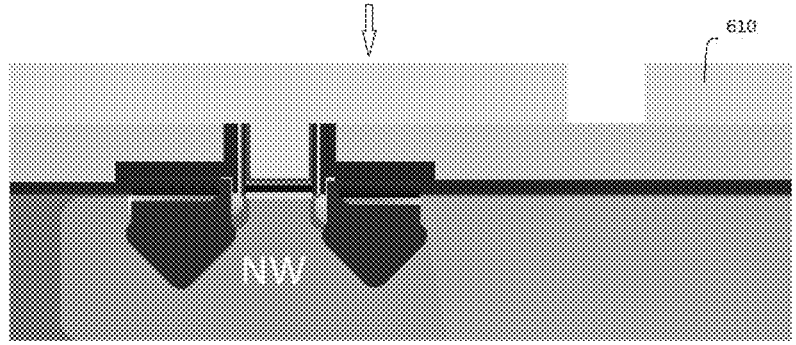
Figure 6C:
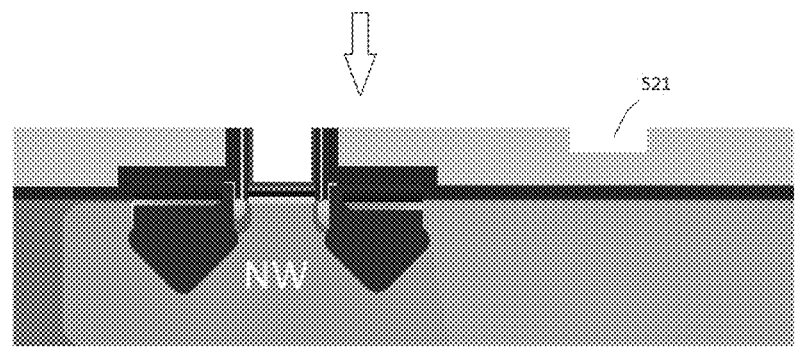
Figure 6D:
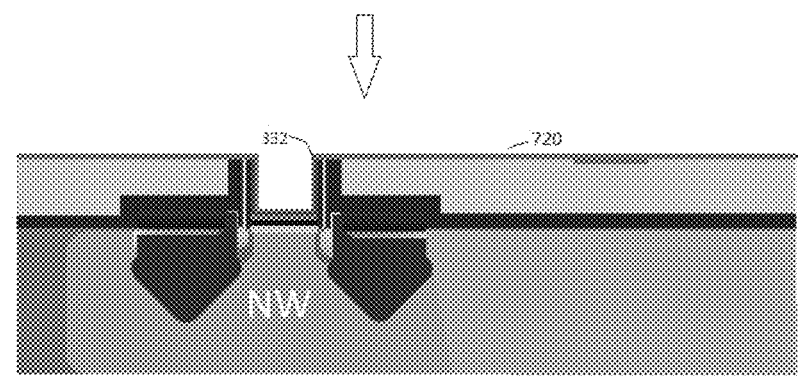
Figure 6E:
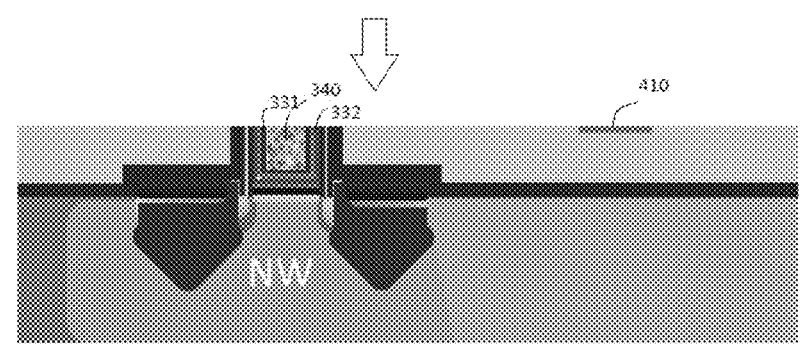
Figure 7A:
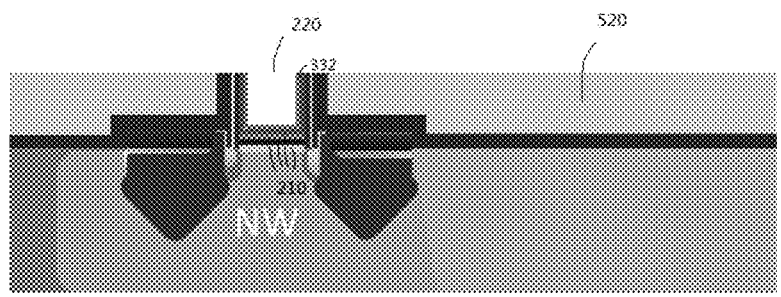
FIGS. 7a-7e illustrate a process for manufacturing a lower electrode plate of an MIM capacitor, according to another embodiment of the present disclosure.
Figure 7B:
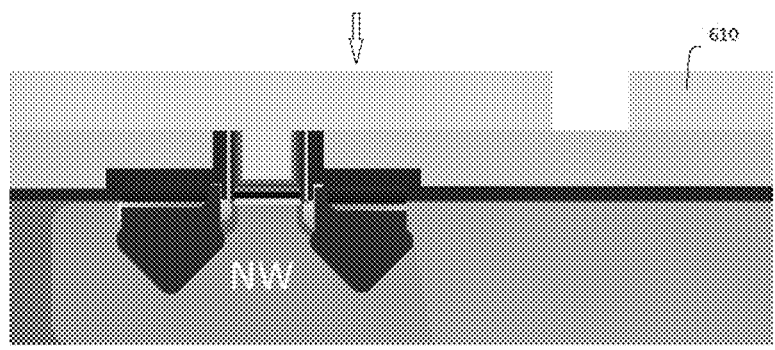
Figure 7C:
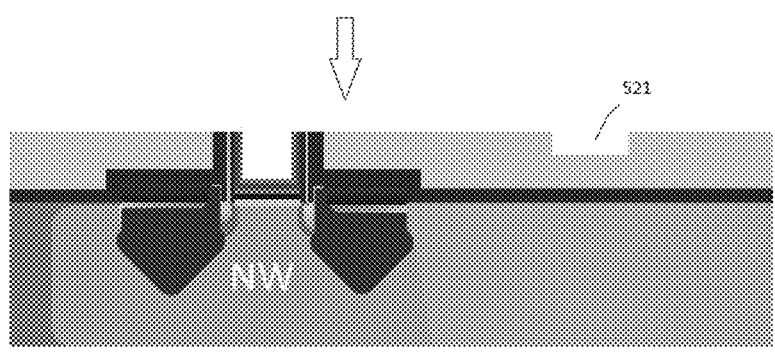
Figure 7D:
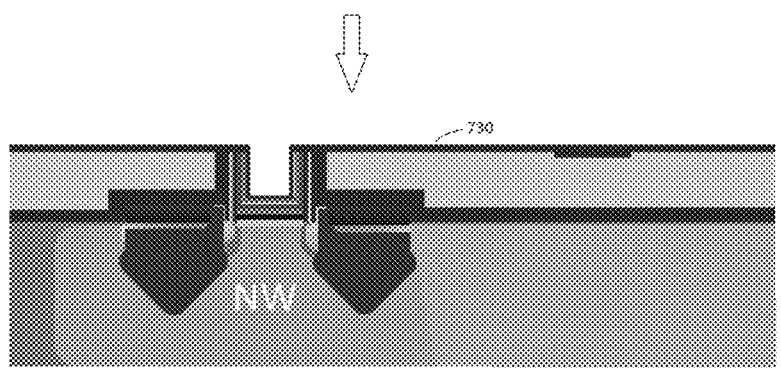
Figure 7E:
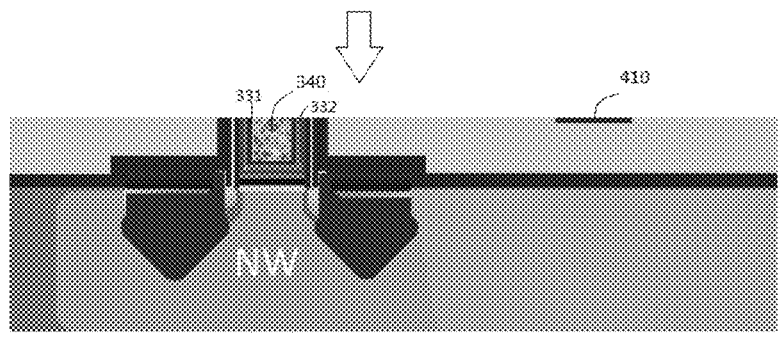

FIG. 4 shows the cross sectional view of an MIM capacitor structure in a semiconductor integrated circuit, according to one embodiment of the present disclosure. The method for manufacturing the MIM capacitor as briefly described in the flow chart of FIG. 3, comprises: S1: providing a semiconductor substrate 100, the semiconductor substrate 100 includes a plurality of well regions such as DNW (deep N-doped well), PW (P-doped well), and NW (N-doped well), polysilicon gate structures, which are formed on the surface of one of the well regions, and each said polysilicon gate structure comprises a gate dielectric layer 211 formed on the surface of the semiconductor substrate 100; forming a dummy gate on the gate dielectric layer 211, removing the dummy gate and replacing it with a metal gate in the removed region of the dummy gate to form a metal gate structure 300, here the metal gate structure 300 includes the gate dielectric layer 210, an electrode barrier layer 330 and a metal gate 340, the gate dielectric layer 210 is formed on the surface of the N-well on the semiconductor substrate 100. The electrode barrier layer 330 is located between the gate dielectric layer 210 and the metal gate 340. structure 200 in the dashed frame is the MIM capacity. A lower electrode plate 410 of the MIM capacitor 200 is formed in the process of forming the metal gate structure 300. Step S2 includes forming a capacitor dielectric layer 420 above the lower electrode plate 410 of the MIM capacitor 200. In step S3, an upper electrode plate 430 of the MIM capacitor is formed above the capacitor's dielectric layer 420, which is a shared layer with the metal gate, such that the capacitor dielectric layer 420 is located between the lower electrode plate 410 and the upper electrode plate 430. As a result, the lower electrode plate 410, the upper electrode plate 430 and the capacitor dielectric layer 420 form the MIM capacitor 200.

As described above, the lower electrode plate of the MIM capacitor 200 is formed in the process of forming the metal gate structure 200. The upper electrode plate 430 of the MIM capacitor 200 and the capacitor dielectric layer 420 between the lower electrode plate 410 and the upper electrode plate 430 are formed in the process of manufacturing the active gate in the semiconductor integrated circuit. Therefore manufacturing MIM capacitor can be completed in one process flow without increasing process steps. The resultant cost is reduced, and the MIM capacitors are more densely packed, capacitors' current leakage is also reduced, meanwhile capacitor's linearity over low voltage ranges is maintained.

In one embodiment of the present disclosure, step S1 further includes forming a sidewall 510 on the side surface of the metal gate structure 300, depositing an interlayer film 520 in the region outside the sidewall 510 of the metal gate structure 300. Before the removal of the dummy gate, a sidewall is formed by depositing a layer on the outer side surface of the dummy gate, and the interlayer film 520 is then deposited over the surface of the sidewall. The top surface of the interlayer film 520 is then polished before the lower electrode plate 410 of the MIM capacitor 200 is patterned in the interlayer film 520.

More specifically, in one embodiment of the present disclosure, the lower electrode plate 410 of the MIM capacitor 200 is formed in the forming process of the metal gate 340 of the metal gate structure 300. Specifically, referring to FIGS. 5a-5e, which illustrate a process for manufacturing a lower electrode plate 410 of an MIM capacitor, according to one embodiment of the present disclosure. Specifically, in step S1, after the interlayer film 520 is deposited, the dummy gate is removed leaving a hole 220, the electrode barrier layer 330 is formed on the gate dielectric layer 210 in the hole 220 of the dummy gate. In a photolithography process, the surface of the interlayer film 520 is covered with a layer of photoresist 610, and the etching process is performed to the patterned photoresist 610 to form a groove 521 in the interlayer film 520. After the photoresist 610 is removed, a metal layer 710 is deposited on the surface of the interlayer film 510 filling the hole 220 left by the removed dummy gate and the groove 521. A planarization process is performed on the interlayer film 520 to remove the metal film 710 on the interlayer film 520, however the planarization process does not remove metals in the hole or in the groove, instead, it exposes the top surface of the metal gate 340 in the hole and the top surface of metal film 410 in the trench 521. Thus, the metal gate 340 on the electrode barrier layer 330 is formed in the hole 220 where the dummy gate was removed from. As the result, the lower electrode plate 410 of the MIM capacitor is simultaneously formed in the groove 521. In other words, the forming process of the lower electrode plate 410 of the MIM capacitor 200 is integrated in the process of forming the metal gate structure 300. Specifically, in one embodiment of the present disclosure, the material of the lower electrode plate 410 of the MIM capacitor and the material of the metal gate 340 are aluminum (Al).

More specifically, as illustrated in FIG. 4, in one embodiment of the present disclosure, the electrode barrier layer 330 further comprises a TiN layer 332 and a TiAl layer 331. The lower electrode plate 410 of the MIM capacitor 200 is formed in the forming process of the TiN layer 332 of the metal gate structure 300.

FIGS. 6a-6e, illustrate the process for forming lower electrode plate 410 of an MIM capacitor 200, according to another embodiment of the present disclosure. Specifically, in step S1, after the dummy gate is removed and the interlayer film 520 is deposited, a photolithography process patterned a layer of photoresist 610, followed by an etching process to form a groove 521 in the interlayer film 520 where the MIM capacitor lower electrode is. A TiN layer 720 is deposited over the top surface of the interlayer film 520, the interior surface of the hole 220 where the dummy gate was removed, and the interior surface of the groove 521. A planarization process is performed to form the TiN layer 332 in the electrode barrier layer 330 on the side walls and on the gate dielectric layer 210 at the bottom surface of the hole 220 where the dummy gate was removed. In this process, the lower electrode plate 410 of the MIM capacitor 200 is simultaneously formed in the groove 521. To form the metal gate, a TiAl layer 331 is deposited as part of the electrode barrier layer 330. A metal gate layer 340 is filled into the hole over the electrode 330 to form the metal gate structure 300. In other words, the forming process of the lower electrode plate 410 of the MIM capacitor 200 is integrated in the process of forming the metal gate structure 300. In some examples, in one embodiment of the present disclosure, the lower electrode plate 410 of the MIM capacitor 200 and metal gate over the TiN layer 332 in the electrode barrier layer 330 share the same material.

More specifically, in one embodiment of the present disclosure, the lower electrode plate 410 of the MIM capacitor 200 is formed in the forming process of the TiAl layer 331 of the metal gate structure 300. Specifically, referring to FIGS. 7a-7e, which illustrate a process for manufacturing a lower electrode plate of an MIM capacitor, according to another embodiment of the present disclosure.

In step S1, after the interlayer film 520 is formed and the dummy gate is removed, a TiN layer 332 in the electrode barrier layer 330 is formed on the gate dielectric layer 210 in the region 220 where the dummy gate was removed. Then the top surface of the interlayer film 520 and the hole 220 are covered with a layer of photoresist 610, a photolithography process and etching process are performed to the photoresist 610 to pattern a groove 521 in the interlayer film 520, followed by stripping the photoresist 610, the hole 220 is reopened. A TiAl layer 730 is deposited on the top surface to cover the bottom surface and sidewalls of the hole 220, to fill the groove 521, and to cover other surfaces of the interlayer film 520. A planarization process is applied on the TiAl layer 730. The TiAl deposited directly on the TiN layer 332 serves as part of the electrode barrier layer 330 in the hole 220 where the dummy gate was removed. The TiAl layer 730 deposited in the groove 521 on the lower electrode plate 410 of the MIM capacitor therefore is simultaneously formed in the as the TiAl 331 in the electrode barrier layer 330. The metal gate 340 is deposited to the hole 220 to complete the metal gate structure 300. In summary, the forming process of the lower electrode plate 410 of the MIM capacitor is integrated in the process of forming the metal gate structure 300. As a result, the material of the lower electrode plate 410 of the MIM capacitor and the material of the TiAl layer 331 in the electrode barrier layer 330 are the same.

As described above, the forming process of the lower electrode plate 410 of the MIM capacitor is integrated in the forming process of the metal gate 340, the TiN layer 332 and TiAl layer 331 respectively. However, it is not limited in the present disclosure. The forming process of the lower electrode plate 410 of the MIM capacitor may be integrated in the forming process of any layer that can be used as the capacitor electrode plate in the metal gate structure 300, such that the lower electrode plate 410 of the MIM capacitor can be simultaneously formed in the manufacturing process of the gate of the CMOS device of the semiconductor device, the manufacturing process of the semiconductor integrated circuit can be decreased and the cost can be reduced.

More specifically, as illustrated in FIG. 4, the gate dielectric layer 210 comprises an interface layer 211, a high dielectric constant layer 212 and etch stop layers 213a and 213b.

The interface layer 211 is located between the high dielectric constant layer 212 and the semiconductor substrate 100.

The etch stop layers 213a and 213b are located between the high dielectric constant layer 212 and the electrode barrier layer 330.

The material of the interface layer 211 comprises silicon oxide.

The material of the high dielectric constant layer 212 comprises silicon dioxide ($SiO_2$), silicon nitride (SiN), aluminum oxide ($Al_2O_3$), tantalum pentoxide ($Ta_2O_5$), yttrium oxide($Y_2O_3$), hafnium silicate oxide, hafnium dioxide ($HfO_2$), lanthanum oxide ($La_2O_3$), zirconium dioxide ($ZrO_2$), strontium titanate ($SrTiO_3$) or zirconium silicate oxide.

The materials for etch stop layers 213a and 213b comprises metal nitride. Preferably, as illustrated in FIG. 4, the metal nitride of the etch stop layer 213a is titanium nitride (TiN), and the metal nitride of the etch stop layer 213b is tantalum nitride(TaN).

In one embodiment of the present disclosure, the capacitor dielectric layer 420 may contain an insulating material between the electrode plates for a capacitor. The material of the capacitor dielectric layer 420 can be silicon nitrite (SiN), hafnium oxide (HFO2), zirconium oxide (ZrO), or aluminum (Al2O3). The capacitor dielectric layer 420 is formed through a deposition process.

As illustrated in FIG. 4, the capacitor dielectric layer 420 formed in step S2 covers the lower electrode plate 410 of the MIM capacitor. In step S3, a titanium nitride layer is formed above the capacitor dielectric layer 420, and then photolithography process and etching process are performed to form the upper electrode plate 430 of the MIM capacitor, such that the lower electrode plate 410, the upper electrode plate 430 and the capacitor dielectric layer 420 form the MIM capacitor. In other words, the high-resistance titanium nitride TiN is used as the upper electrode plate. The method for manufacturing the MIM capacitor further comprises S4: after the upper electrode plate 430 of the MIM capacitor is formed, depositing a second interlayer film 530, to cover all the exposed regions (not shown) on the semiconductor substrate 100. A plurality of grooves are patterned in the second interlayer film 530 by a photolithography/etching process, a metal layer is filled into the plurality of grooves to form a plurality of conductive vias 800. One of the vias is connected to the metal gate 340 of the metal gate structure 300 to form a gate of a CMOS device, one of the vias is connected to the upper electrode plate 430 of the MIM capacitor to interconnect the upper electrode plate of the MIM capacitor, and one of the vias penetrates through the capacitor dielectric layer 420 to connect to the lower electrode plate 410 of the MIM capacitor.

More specifically, the capacitor dielectric layer 420 formed in step S2 covers of the MIM capacitor the lower electrode plate 410 and the interlayer film 520. As illustrated in FIG. 4, more specifically, in one embodiment of the present disclosure, in step S3, a titanium nitride layer is formed above the capacitor dielectric layer 420, then photolithography process and etching process are performed to form a plurality of titanium nitride layer electrode plates 700, and one of the titanium nitride layer electrode plates is located above the capacitor dielectric layer 420 to form the upper electrode plate 430 of the MIM capacitor, such that the lower electrode plate 410, the upper electrode plate 430 and the capacitor dielectric layer 420 form the MIM capacitor. As illustrated in FIG. 4, more specifically, the method for manufacturing the MIM capacitor further comprises S4: after the upper electrode plate 430 of the MIM capacitor is formed, forming a second interlayer film 530, the second interlayer film 530 covers all the exposed regions (not shown) on the semiconductor substrate, then performing photolithography process and etching process to form a plurality of grooves in the second interlayer film 530, and filling metal into the plurality of grooves to form a plurality of vias 800, such that one of the vias is connected with the metal gate 340 of the metal gate structure 300 to form a gate of a CMOS device, one of the vias is connected with the upper electrode plate 430 of the MIM capacitor to form one electrode plate of the MIM capacitor, one of the vias penetrates through the capacitor dielectric layer 420 and is connected with the lower electrode plate 410 of the MIM capacitor to form the other electrode plate of the MIM capacitor, and the plurality of vias 800 comprise a via connected with the titanium nitride layer electrode plate 700 other than the titanium nitride layer electrode plate 700 used as the upper electrode plate 430 of the MIM capacitor, so as to form an active device or passive device in the semiconductor integrated circuit. In other words, the manufacturing of the upper electrode plate 430 of the MIM capacitor is simultaneously completed in the manufacturing process of the active device or passive device in the semiconductor integrated circuit.

In the manufacturing process of the semiconductor integrated circuit, the manufacturing of the titanium nitride layer is often necessary. In the present disclosure, part of the titanium nitride layer 700 is used as the upper electrode plate 430 of the MIM capacitor. In other words, the manufacturing process of the upper electrode plate 430 of the MIM capacitor is integrated with forming other titanium nitride layer necessary for the semiconductor integrated circuit, such that the manufacturing of the MIM capacitor can be simultaneously completed in the process of manufacturing the semiconductor integrated circuit. As a result, the total process steps of manufacturing the semiconductor integrated circuit with MIM capacitors are not increased, the cost is reduced, and the MIM capacitors have the characteristics of high capacitance density, low leakage, and low voltage linearity.

The above disclosed method for manufacturing the MIM capacitor is applicable to the notes of 28 nm, 14 nm or lower.

In some example, the above planarization process is chemical mechanical grinding process (CMP).

In some examples, the forming process of any material layer may be any film forming process applicable to the industry, such as deposition process.

In some examples, the present disclosure further provides an MIM capacitor. The MIM capacitor is manufactured by adopting the above method for manufacturing the MIM capacitor.

In a summary, the lower electrode plate of the MIM capacitor is formed in the process of forming the metal gate structure. The upper electrode plate, the capacitor dielectric layer and the lower electrode plate of the MIM capacitor are fabricated in an integrated process with along with all the other steps of making the device layers. The overall process steps of manufacturing the semiconductor integrated circuit are not increased, the cost of making MIM devices is reduced, and the resultant MIM capacitors have the characteristics of high capacitance density, low leakage, and linearity in low voltage range.

Finally, it should be noted that the above embodiments are only used for describing the technical solutions of the present disclosure, instead of limiting the technical solutions. Although the present disclosure is described in detail with reference to the above embodiments, it should be understood by one skilled in the art that the technical solutions recorded in the above embodiments may still be modified, or some or all of the technical features may be replaced equivalently. These modifications or replacements do not make the essence of the corresponding technical solution deviate from the scope of the technical solutions of the embodiments of the present disclosure.

What is claimed is:

1. A method for manufacturing an MIM capacitor, comprising steps of:

S1: providing a semiconductor substrate;
   forming a plurality of well regions in the semiconductor substrate;
   forming a gate dielectric layer on a surface of the semiconductor substrate;
   forming a polysilicon gate structure on a surface of the plurality of well regions;
   forming a dummy gate on the gate dielectric layer, wherein the dummy gate is removed then to expose the gate dielectric layer;
   forming a metal gate structure on the exposed gate dielectric layer, wherein the metal gate structure comprises an electrode barrier layer on the gate dielectric layer and a metal gate on the gate dielectric layer;
   forming a sidewall on the dummy gate and disposing a first interlayer film on the substrate before the removal of the dummy gate; and
   performing a photolithography process and an etching process, wherein a layer of photoresist is patterned into a first groove in the first interlayer film;
   wherein a metal layer is deposed on the electrode barrier layer in a region where the dummy gate is removed;
   wherein a planarization process is performed on the metal gate and the lower electrode plate of the MIM capacitor in the first groove;
   wherein a lower electrode plate of the MIM capacitor is formed in the process of forming the metal gate; and
   wherein the lower electrode plate of the MIM capacitor is formed in the first interlayer film;

S2: forming a capacitor dielectric layer above the lower electrode plate of the MIM capacitor; and S3: forming an upper electrode plate of the MIM capacitor on the capacitor dielectric layer to make the MIM capacitor.

2. The method for manufacturing the MIM capacitor according to claim 1, wherein a material of the lower electrode plate of the MIM capacitor and a material of the metal gate are both aluminum.

3. The method for manufacturing the MIM capacitor according to claim 1, wherein the capacitor dielectric layer formed in step S2 fully covers the lower electrode plate of the MIM capacitor.

4. The method for manufacturing the MIM capacitor according to claim 1, wherein a material of the capacitor dielectric layer is silicon nitrite (SiN), hafnium oxide (HFO2), zirconium oxide (ZrO), or aluminum oxide (Al2O3).

5. The method for manufacturing the MIM capacitor according to claim 1, wherein the capacitor dielectric layer formed in step S2 covers the lower electrode plate and the first interlayer film of the MIM capacitor; and
   wherein the step S3 further comprises a TiN layer formed above the capacitor dielectric layer,
   wherein a photolithography process and an etching process are performed to pattern a plurality of TiN layer electrode plates, wherein one of the TiN layer electrode plates is located above the capacitor dielectric layer to form the upper electrode plate of the MIM capacitor, such that the lower electrode plate, the upper electrode plate and the capacitor dielectric layer form the MIM capacitor.

6. The method for manufacturing the MIM capacitor according to claim 5, wherein the method further comprises a step of:
   S4: after the upper electrode plate of the MIM capacitor is formed in the step S3, forming a second interlayer film on a top surface;
   performing a photolithography process and an etching process to pattern a second groove in the second interlayer film; and
   filling the second groove with metal to form a via;
   wherein the via connects to the metal gate of the metal gate structure, wherein the via connects to the upper electrode plate of the MIM capacitor, wherein the via penetrates through the capacitor dielectric layer and connects to the lower electrode plate of the MIM capacitor to form another electrode plate of the MIM capacitor, and wherein the via connects to one of the plurality of the TiN layer electrode plates directly.

7. A method for manufacturing an MIM capacitor, comprising steps of:
   S1: providing a semiconductor substrate;
   forming a plurality of well regions in the semiconductor substrate;
   forming a gate dielectric layer on a surface of the semiconductor substrate;
   forming a polysilicon gate structure on a surface of the plurality of well regions;
   forming a dummy gate on the gate dielectric layer, wherein the dummy gate is removed then to expose the gate dielectric layer;
   forming a sidewall on the dummy gate and disposing an interlayer film on the substrate before removing the dummy gate; and
   forming a metal gate structure on the exposed gate dielectric layer, wherein the metal gate structure comprises an electrode barrier layer on the gate dielectric layer and a metal gate on the gate dielectric layer;

wherein the step S1 further comprises:
   performing a photolithography process and an etching process to pattern a groove in the interlayer film, followed by disposing a TiN layer on a surface of a region where the dummy gate is removed, as well as in the groove and a surface of the interlayer film;
   performing a planarization process on the TiN layer inside the electrode barrier layer on the gate dielectric layer, and the lower electrode plate of the MIM capacitor in the groove;
   wherein a lower electrode plate of the MIM capacitor is formed in a process of forming the metal gate structure;
   wherein the electrode barrier layer comprises the TiN layer and a TiAl layer;
   wherein the lower electrode plate of the MIM capacitor is formed in a same process of forming the TiN layer of the metal gate structure; and
   wherein the lower electrode plate of the MIM capacitor is formed in the interlayer film;
   S2: forming a capacitor dielectric layer above the lower electrode plate of the MIM capacitor; and
   S3: forming an upper electrode plate of the MIM capacitor on the capacitor dielectric layer to make the MIM capacitor.

8. The method for manufacturing the MIM capacitor according to claim 7, wherein a material of the lower electrode plate of the MIM capacitor is a same as a material of the TiN layer in the electrode barrier layer.

9. The method for manufacturing the MIM capacitor according to claim 8, wherein the lower electrode plate of the MIM capacitor is formed in a same process of forming the TiAl layer of the metal gate structure.

10. The method for manufacturing the MIM capacitor according to claim 9, wherein the TiAl layer is disposed in the groove, in the metal gate structure where the dummy gate is removed, and on the surface of the interlayer film; wherein a planarization process is performed on the TiAl layer including metal gate structure area and the lower electrode plate of the MIM capacitor.

11. The method for manufacturing the MIM capacitor according to claim 10, wherein a material of the lower electrode plate of the MIM capacitor is a same as a material of the TiAl layer in the electrode barrier layer.

12. A method for manufacturing an MIM capacitor, comprising steps of:
   S1: providing a semiconductor substrate;
   forming a plurality of well regions in the semiconductor substrate;
   forming a gate dielectric layer on a surface of the semiconductor substrate;
   forming a polysilicon gate structure on a surface of the plurality of well regions;
   forming a dummy gate on the gate dielectric layer, wherein the dummy gate is removed then to expose the gate dielectric layer; and
   forming a metal gate structure on the exposed gate dielectric layer, wherein the metal gate structure comprises an electrode barrier layer on the gate dielectric layer and a metal gate on the gate dielectric layer;
   wherein a lower electrode plate of the MIM capacitor is formed in a process of forming the metal gate structure;
   S2: forming a capacitor dielectric layer above the lower electrode plate of the MIM capacitor; and
   S3: forming an upper electrode plate of the MIM capacitor on the capacitor dielectric layer to make the MIM capacitor;

forming a TiN layer above the capacitor dielectric layer, and performing a photolithography process and an etching process to pattern the upper electrode plate of the MIM capacitor, such that the lower electrode plate, the upper electrode plate and the capacitor dielectric layer form the MIM capacitor.

13. The method for manufacturing the MIM capacitor according to claim 12, wherein the method further comprises a step after the step S3:

S4: forming an interlayer film on all top surfaces;

performing a photolithography process and an etching process to pattern a plurality of grooves in the interlayer film; and filling a metal into the plurality of grooves to form vias, wherein one of the vias connects to the metal gate of the metal gate structure, one of the vias connects to the upper electrode plate of the MIM capacitor, and one of the vias penetrates through the capacitor dielectric layer and connects to the lower electrode plate of the MIM.

14. An MIM capacitor, made with the method according to claim 12.

* * * * *